(12) United States Patent
Iida

(10) Patent No.: US 10,763,849 B2
(45) Date of Patent: Sep. 1, 2020

(54) SEMICONDUCTOR INTEGRATED CIRCUIT

(71) Applicant: Socionext Inc., Kanagawa (JP)

(72) Inventor: Masahisa Iida, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/557,851

(22) Filed: Aug. 30, 2019

(65) Prior Publication Data
US 2019/0386653 A1    Dec. 19, 2019

Related U.S. Application Data

(63) Continuation of application No. PCT/JP2018/005542, filed on Feb. 16, 2018.

(30) Foreign Application Priority Data

Mar. 3, 2017  (JP) .................................. 2017-040625

(51) Int. Cl.
H03K 17/16    (2006.01)

(52) U.S. Cl.
CPC .................................. *H03K 17/162* (2013.01)

(58) Field of Classification Search
CPC ........... H03K 17/162; H03K 17/04106; H03K 19/0175; H01L 27/04; H01L 21/822
See application file for complete search history.

(56) References Cited

U.S. PATENT DOCUMENTS

| 7,868,659 B2 * | 1/2011 | Ker ...................... H03K 3/0375 326/81 |
| 8,283,947 B1 * | 10/2012 | Ubaradka ........ H03K 19/01852 326/58 |
| 2005/0189963 A1 | 9/2005 | Uno |
| 2005/0200381 A1 | 9/2005 | Arai |

FOREIGN PATENT DOCUMENTS

| JP | 2005-260587 A | 9/2005 |
| WO | 2004/107578 A1 | 12/2004 |

OTHER PUBLICATIONS

International Search Report issued in corresponding PCT/JP2018/005542, dated May 15, 2018, with English translation.
Written Opinion issued in corresponding PCT/JP2018/005542, dated May 15, 2018, with partial English translation.

* cited by examiner

*Primary Examiner* — John W Poos
(74) *Attorney, Agent, or Firm* — McDermott Will & Emery LLP

(57) ABSTRACT

A semiconductor integrated circuit includes: a power supply terminal that receives a power supply voltage; an external terminal; an output PMOS transistor connected between the power supply terminal and the external terminal; an auxiliary PMOS transistor connected between a gate of the output PMOS transistor and the external terminal; and a bias voltage generating circuit connected to a gate of the auxiliary PMOS transistor. The bias voltage generating circuit supplies a voltage lower than the power supply voltage to the gate of the auxiliary PMOS transistor, if it is necessary to maintain an OFF state of the output PMOS transistor by supplying an external voltage received at the external terminal to the gate of the output PMOS transistor.

15 Claims, 8 Drawing Sheets

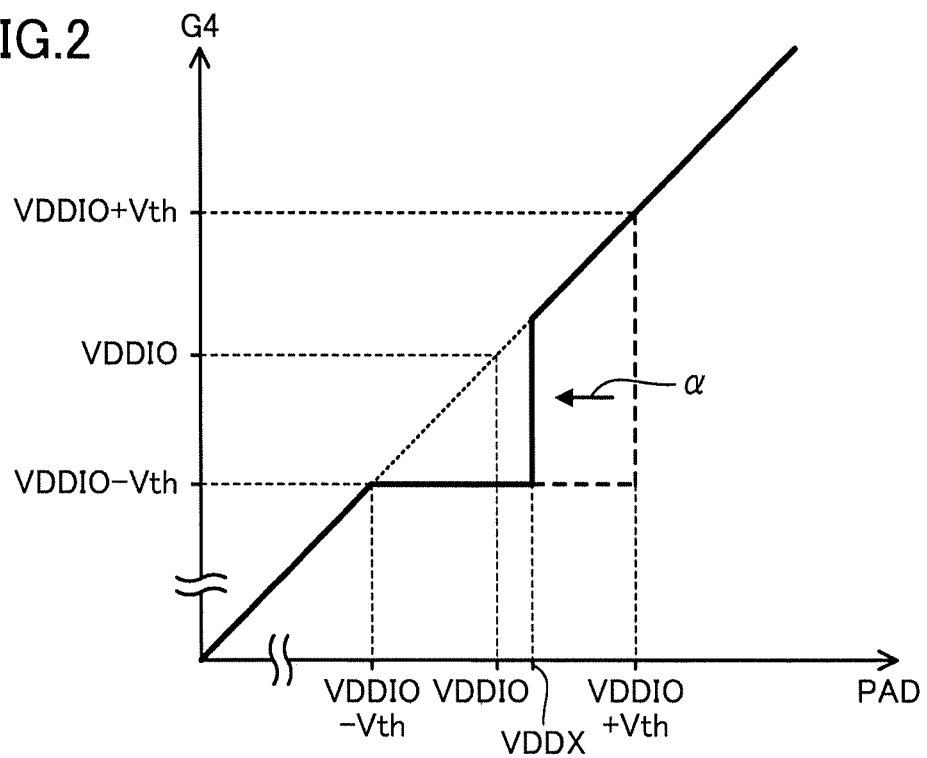
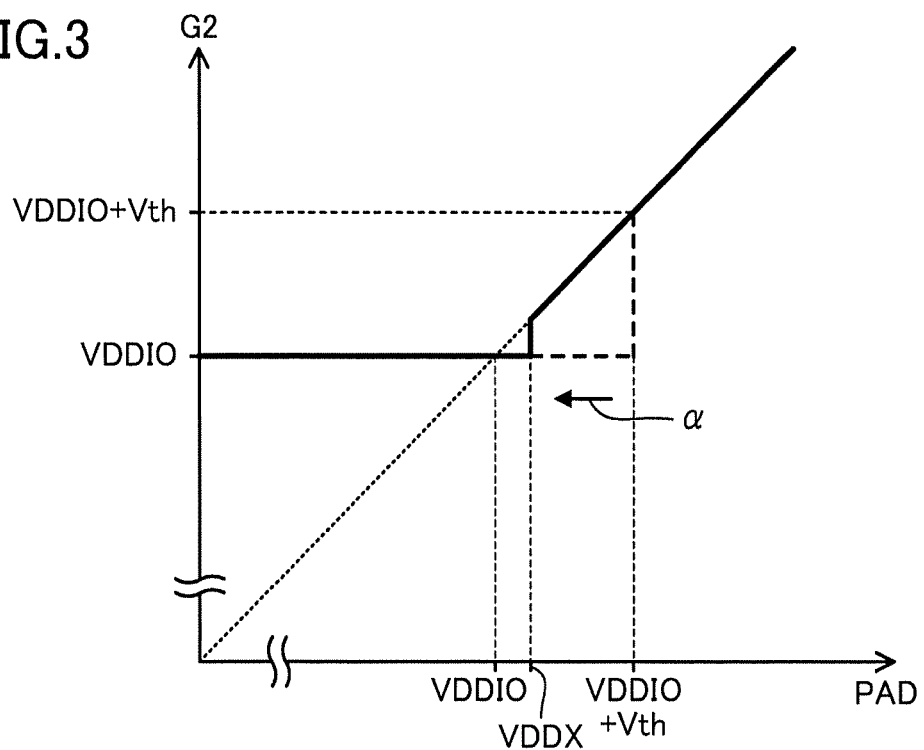

SEMICONDUCTOR INTEGRATED CIRCUIT

CROSS-REFERENCE TO RELATED APPLICATIONS

This is a continuation of International Application No. PCT/JP2018/005542 filed on Feb. 16, 2018, which claims priority to Japanese Patent Application No. 2017-040625 filed on Mar. 3, 2017. The entire disclosures of these applications are incorporated by reference herein.

BACKGROUND ART

The present disclosure relates to a semiconductor integrated circuit including an external terminal capable of receiving an external voltage higher than the circuit's own power supply voltage.

To build a semiconductor system using metal oxide semiconductor (MOS) transistors, external terminals of two semiconductor integrated circuits operating at different power supply voltages may be connected directly to each other. In this case, one of the semiconductor integrated circuits receives, at its external terminal, a voltage higher than the own power supply voltage. Even in this case, known art feeds the external voltage received at the external terminal back to the control system for the following purposes. The known art aims to address the problem of breakdown of P-channel MOS (PMOS) transistors constituting an output circuit and to reduce leakage currents from the external terminal to the power supply terminal (see, e.g., WO2004/107578).

SUMMARY

In the known art, if the integrated circuit receives an external voltage higher than the own power supply voltage and there is a small difference between the voltages, the gate voltages of the PMOS transistors constituting the output circuit change late. As a result, a large leakage current may transiently flow from the external terminal to the power supply terminal.

The semiconductor integrated circuit according to the present disclosure accelerates the changes in the gate voltages of the PMOS transistors constituting the output circuit to reduce transient leakage currents upon receipt of an external voltage higher than its own power supply voltage.

The semiconductor integrated circuit according to an aspect of the present disclosure includes: a first input terminal that receives a control signal for controlling switching between an output mode and a non-output mode; a second input terminal that receives an input data signal; a power supply terminal that receives a power supply voltage; an external terminal capable of receiving an external voltage higher than the power supply voltage in the non-output mode; and a first PMOS transistor and a second PMOS transistor connected in series between the power supply terminal and the external terminal. A gate of the first PMOS transistor is driven: by a signal corresponding to the input data signal in the output mode; and by the power supply voltage in the non-output mode. A gate of the second PMOS transistor is driven: by a ground voltage in the output mode; and in the non-output mode, where a critical voltage is lower than a sum of the power supply voltage and a threshold voltage of a MOS transistor, by the power supply voltage, if the external voltage received at the external terminal is lower than the critical voltage; and by the external voltage received at the external terminal, if the external voltage received at the external terminal is higher than or equal to the critical voltage.

The semiconductor integrated circuit according to another aspect of the present disclosure includes: a first input terminal that receives a control signal for controlling switching between an output mode and a non-output mode; a second input terminal that receives an input data signal; a power supply terminal that receives a power supply voltage; an external terminal capable of receiving an external voltage higher than the power supply voltage in the non-output mode; and an output PMOS transistor connected between the power supply terminal and the external terminal. A gate of the output PMOS transistor is driven: by a signal corresponding to the input data signal in the output mode; and in the non-output mode, where a critical voltage is lower than a sum of the power supply voltage and a threshold voltage of a MOS transistor, by the power supply voltage, if the external voltage received at the external terminal is lower than the critical voltage; and by the external voltage received at the external terminal, if the external voltage received at the external terminal is higher than or equal to the critical voltage.

The semiconductor integrated circuit according to another aspect of the present disclosure includes: a power supply terminal; an external terminal; an output PMOS transistor connected between the power supply terminal and the external terminal, an auxiliary PMOS transistor connected between a gate of the output PMOS transistor and the external terminal; and a bias voltage generating circuit connected to a gate of the auxiliary PMOS transistor. The bias voltage generating circuit supplies a voltage lower than a power supply voltage to the gate of the auxiliary PMOS transistor, if it is necessary to maintain an OFF state of the output PMOS transistor by supplying an external voltage received at the external terminal to the gate of the output PMOS transistor.

The semiconductor integrated circuit according to the present disclosure reduces transient leakage currents upon receipt of an external voltage higher than its own power supply voltage.

BRIEF DESCRIPTION OF THE DRAWINGS

FIG. 2 is a graph illustrating the relation between an external voltage received at an external terminal and a gate voltage of a fourth PMOS transistor in a non-output (i.e., input) mode of the semiconductor integrated circuit of FIG. 1.

FIG. 3 is a graph illustrating the relation between the external voltage received at the external terminal and a gate voltage of a second PMOS transistor in the non-output (i.e., input) mode of the semiconductor integrated circuit of FIG. 1.

DETAILED DESCRIPTION

Now, five embodiments of the present disclosure will be described with reference to the drawings.

First Embodiment

Figure 1:
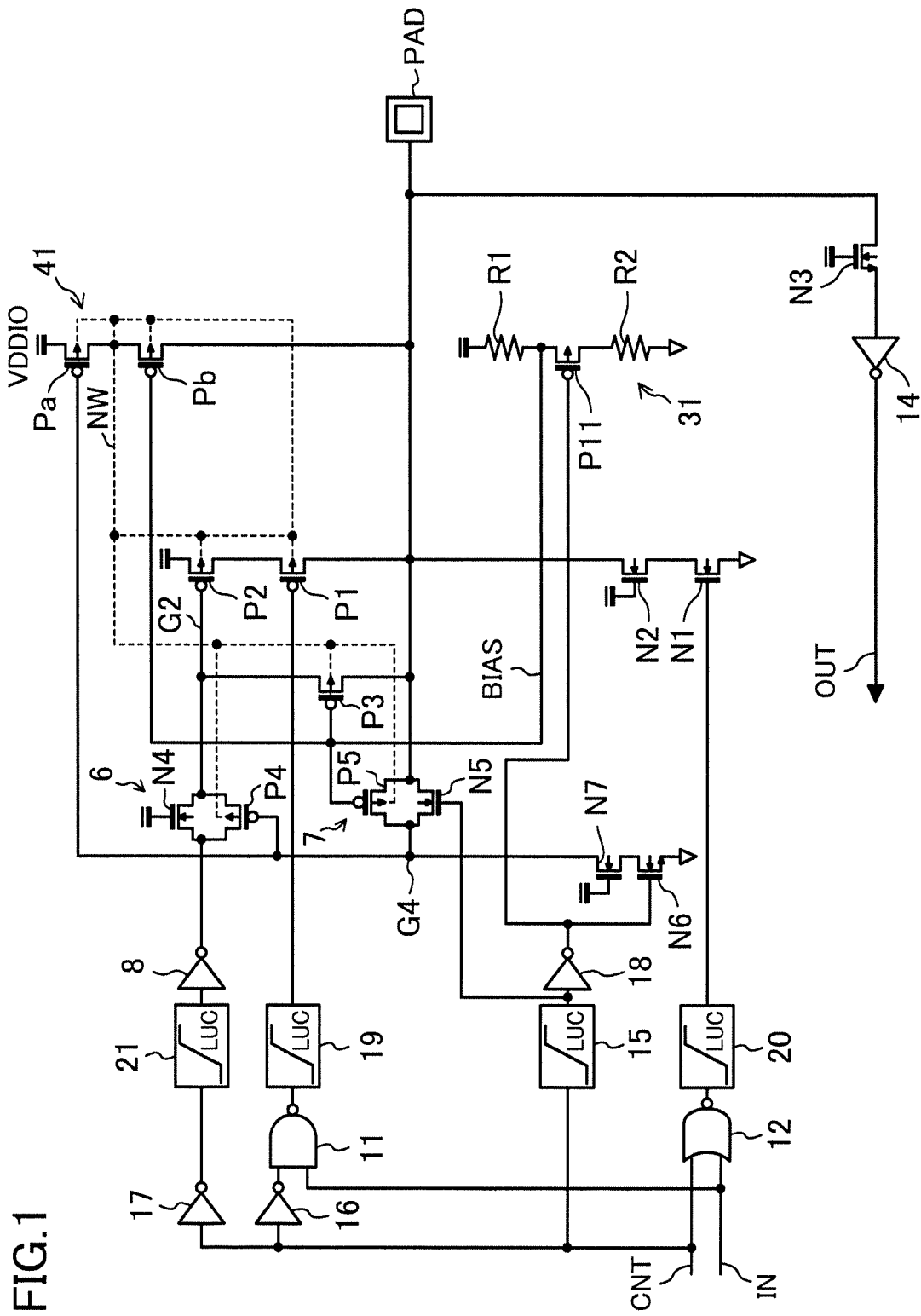
FIG. 1 is a circuit diagram of a semiconductor integrated circuit according to a first embodiment.

FIG. 1 is a circuit diagram of a semiconductor integrated circuit according to a first embodiment. The semiconductor integrated circuit of FIG. 1 includes input/output cells, each cell including first and second input terminals, a power supply terminal, a ground terminal, an external terminal PAD, and an output terminal. The first input terminal receives a control signal CNT for controlling switching between an output mode and a non-output (i.e., input) mode. The second input terminal receives an input data signal IN. The power supply terminal receives a power supply voltage VDDIO. The ground terminal receives a ground voltage. The external terminal PAD is capable of receiving an external voltage higher than the power supply voltage VDDIO in the non-output mode. The output terminal outputs an output data signal OUT. In the following description, the following values are used as an example. The control signal CNT, the input data signal IN, and the output data signal OUT are logic signals with amplitudes of 0.9 V. The power supply voltage VDDIO is 1.8 V. The ground voltage is 0 V. The external terminal PAD receives a logic signal voltage with an amplitude of 2.5 V from the outside. In addition, not only the power supply voltage, but also the power supply terminal is represented by "VDDIO." Furthermore, not only the external terminal, but also the voltage (i.e. the external voltage) at the external terminal is represented by "PAD."

The semiconductor integrated circuit of FIG. 1 includes the following transistors as an output circuit. A first PMOS transistor P1 and a second PMOS transistor P2 are connected in series between the external terminal PAD and the power supply terminal VDDIO. A first N-channel MOS (NMOS) transistor N1 and a second NMOS transistor N2 are connected in series between the ground terminal and the external terminal PAD. The integrated circuit also includes, as an input circuit, a third NMOS transistor N3 and an inverter 14 between the external terminal PAD and the output terminal. The present disclosure may be modified to a semiconductor integrated circuit including output cells without any input circuit.

A third PMOS transistor P3 is connected between the gate G2 of the second PMOS transistor P2 and the external terminal PAD. A fourth PMOS transistor P4 and a fourth NMOS transistor N4 constitute a first transfer gate 6, whereas a fifth PMOS transistor P5 and a fifth NMOS transistor N5 constitute a second transfer gate 7. The external terminal PAD is connected to the input of the second transfer gate 7. The output of the second transfer gate 7 is connected to the gate G4 of the fourth PMOS transistor P4. The output of the first transfer gate 6 is connected to the gate G2 of the second PMOS transistor P2. The gate of the fourth NMOS transistor N4 is connected to the power supply terminal VDDIO. A sixth NMOS transistor N6 and a seventh NMOS transistor N7 are connected in series between the ground terminal and the gate G4 of the fourth PMOS transistor P4.

The semiconductor integrated circuit of FIG. 1 includes first, second, third, and fourth level-up converters (LUCs) 15, 19, 20, and 21, each for converting a logic signal with an amplitude of 0.9 V into a logic signal with an amplitude of 1.8 V. The first LUC 15 includes an input that receives the control signal CNT, and an output connected to the gate of the fifth NMOS transistor N5. The output of the first LUC 15 is also connected to the gate of the sixth NMOS transistor N6 via an inverter 18. The gate of the seventh NMOS transistor N7 is connected to the power supply terminal VDDIO. The second LUC 19 includes an input connected to the output of a NAND gate 11, and an output connected to the gate of the first PMOS transistor P1. The NAND gate 11 receives the signal obtained through inversion of the control signal CNT using an inverter 16, and the input data signal IN. The third LUC 20 includes an input connected to the output of a NOR gate 12, and an output connected to the gate of the first NMOS transistor N1. The NOR gate 12 receives the control signal CNT and the input data signal IN. The gate of the second NMOS transistor N2 is connected to the power supply terminal VDDIO. The fourth LUC 21 includes an input that receives a signal obtained through inversion of the control signal CNT using an inverter 17, and an output connected to the input of the first transfer gate 6 via an inverter 8.

The semiconductor integrated circuit of FIG. 1 further includes an N-well voltage generating circuit 41. The circuit 41 includes a first well voltage generating PMOS transistor Pa and a second well voltage generating PMOS transistor Pb connected in series between the power supply terminal VDDIO and the external terminal PAD. The gate of the first well voltage generating PMOS transistor Pa is connected to the gate G4 of the fourth PMOS transistor P4. The connection node between the first and second well voltage generating PMOS transistors Pa and Pb has an N-well voltage NW. The N-well voltage NW is supplied to the back gates of the first to fifth PMOS transistors P1 to P5 and the back gates of the first and second well voltage generating PMOS transistors Pa and Pb.

The semiconductor integrated circuit of FIG. 1 further includes a bias voltage generating circuit 31. The circuit 31 is a voltage divider circuit including a first resistive element R1, a first bias PMOS transistor P11, and a second resistive element R2 connected in series between the power supply terminal VDDIO and the ground terminal. The gate of the first bias PMOS transistor P11 is connected to the output of the first LUC 15 via the inverter 18. The connection node between the first resistive element R1 and the first bias PMOS transistor P11 has a bias voltage BIAS. The bias voltage BIAS is supplied to the gates of the third PMOS transistor P3, the fifth PMOS transistor P5, and the second well voltage generating PMOS transistor Pb.

Next, an operation of the semiconductor integrated circuit of FIG. 1 will be described. In order to simplify the description, the threshold voltages of the MOS transistors are set to Vth, regardless of the channel types, P or N. When the first bias PMOS transistor P11 is off, the bias voltage BIAS is equal to the power supply voltage VDDIO, that is, BIAS=VDDIO. On the other hand, when the first bias PMOS transistor P11 is turned on, the bias voltage BIAS becomes lower than the power supply voltage VDDIO by a difference α, that is BIAS=VDDIO−α. Note that 0<α<Vth. In the following description, not only the gate itself of the second PMOS transistor P2, but also the voltage at the gate is represented by "G2." In addition, not only the gate itself of the fourth PMOS transistor P4 but also the voltage at the gate is represented by "G4."

Case 1 where CNT=L (=0 V), i.e., in Output Mode

The first LUC 15 maintains the L output, the fourth LUC 21 holds the H output, and the second and third LUCs 19 and 20 output the respective inverted logic signal of the input data signal IN. Accordingly, the fifth NMOS transistor N5 maintains the OFF state. Since the first bias PMOS transistor P11 maintains the OFF state, no voltage drop occurs at the first resistive element R1, resulting in BIAS=VDDIO (=1.8 V). As a result, all the third PMOS transistor P3, the fifth PMOS transistor P5, and the second well voltage generating PMOS transistor Pb maintain the OFF state. On the other hand, since the sixth and seventh NMOS transistors N6 and N7 maintain the ON state, G4=L (=0 V) and both the fourth PMOS transistor P4 and the first well voltage generating PMOS transistor Pa are turned on. Therefore, NW=VDDIO (=1.8 V). Both the fourth PMOS transistor P4 and the fourth NMOS transistor N4 which constitute the first transfer gate 6 are in the ON state. Thus, upon receipt of the L output of the inverter 8, G2=L (=0 V). As a result, the second PMOS transistor P2 maintains the ON state. On the other hand, the second NMOS transistor N2 maintains the ON state, and the first PMOS transistor P1 and the first NMOS transistor N1 are complementarily turned on or off in accordance with the input data signal IN. As a result, if IN=H (=0.9 V), PAD=VDDIO (=1.8 V). If IN=L (=0 V), PAD=L (=0 V).

Case 2 where CNT=H (=0.9 V), i.e., in Non-Output (Input) Mode

In the input mode, the output data signal OUT is obtained, which corresponds to the logic voltage received at the external terminal PAD from the outside. On the other hand, the first and third LUCs 15 and 19 maintain the H output, while the second and fourth LUCs 20 and 21 maintain the L output, regardless of the H/L of the input data signal IN. Accordingly, both the first NMOS transistor N1 and the sixth NMOS transistor N6 maintain the OFF state. The first bias PMOS transistor P11 maintains the ON state to allow a current determined by the combined resistance of the first and second resistive elements R1 and R2 and the first bias PMQS transistor P11 in series to flow. Then, voltage drop occurs at the first resistive element R1, resulting in BIAS=VDDIO−α.

Now, the operation will be described on a case-by-case basis according to the magnitude of the external voltage received at the external terminal PAD.

Case 2a, where PAD<VDDIO−Vth

Since the fifth NMOS transistor N5 is turned on, G4=PAD. As a result, the first well voltage generating PMOS transistor Pa maintains the ON state, whereas the second well voltage generating PMOS transistor Pb maintains the OFF state, resulting in NW=VDDIO (=1.8 V). Since the third PMOS transistor P3 maintains the OFF state and the fourth PMOS transistor P4 maintains the ON state, G2=VDDIO (=1.8 V) and the second PMOS transistor P2 maintains the OFF state. On the other hand, upon receipt of the output of the second LUC 19, the first PMOS transistor P1 also maintains the OFF state.

Case 2b where VDDIO−Vth≤PAD<VDDIO+Vth−α

From the effect of the fifth NMOS transistor N5, G4=VDDIO-Vth. As a result, both the first and second well voltage generating PMOS transistors Pa and Pb maintain the OFF state, and the node of the N-well voltage NW floats. In this case, the N-well voltage NW maintains the immediately preceding state. Since the third PMOS transistor P3 maintains the OFF state and the fourth PMOS transistor P4 maintains the ON state, G2=VDDIO (=1.8 V) and the second PMOS transistor P2 maintains the OFF state. On the other hand, upon receipt of the output of the second LUC 19, the first PMOS transistor P1 also maintains the OFF state.

Case 2c where PAD≥VDDIO+Vth−α

Under the influence of a high external voltage PAD, all the third PMOS transistor P3, the fifth PMOS transistor P5, and the second well voltage generating PMOS transistor Pb, which receive the bias voltage BIAS as the common gate voltage, are turned on. Therefore, G2=PAD and G4=PAD. The first well voltage generating PMOS transistor Pa is turned off, and NW=PAD. On the other hand, the first PMOS transistor P1 is turned on under the influence of the high external voltage PAD, whereas the second PMOS transistor P2 tries to maintain the OFF state.

FIG. 2 is a graph illustrating the relation between the external voltage received at the external terminal PAD and the voltage at the gate G4 of the fourth PMOS transistor P4 in the non-output (i.e., input) mode of the semiconductor integrated circuit of FIG. 1. Here, the critical voltage VDDX is defined by the equation VDDX=VDDIO+Vth−α. Since 0<α<Vth as described above, VDDIO<VDDX<VDDIO+Vth. As described above in Sections 2a to 2c, where PAD<VDDIO−Vth, G4=PAD. Where VDDIO−Vth≤PAD<VDDX, G4=VDDIO−Vth. Where PAD≥VDDX, G4=PAD. It is found that the voltage at the gate G4 of the fourth PMOS transistor P4 rises up, when the external voltage received at the external terminal PAD is relatively low, as compared to the case where α=0.

FIG. 3 is a graph illustrating the relation between the external voltage received at the external terminal PAD and the voltage of the gate G2 of the second PMOS transistor P2 in the non-output (i.e., input) mode of the semiconductor integrated circuit of FIG. 1. As described above in Sections 2a to 2c, where PAD<VDDX, G2=VDDIO. Where PAD≥VDDX, G2=PAD. It is found that the voltage at the gate G2 of the second PMOS transistor P2 rises up, when the external voltage received at the external terminal PAD is relatively low, as compared to the case where α=0.

As described above, the gate of the first PMOS transistor P1 is driven by a signal corresponding to the input data signal IN in the output mode, and by the power supply voltage VDDIO in the non-output (i.e., input) mode. On the other hand, the gate G2 of the second PMOS transistor P2 is driven by the ground voltage in the output mode. In the non-output (i.e., input) mode, as shown in FIG. 3, if the external voltage PAD is lower than the critical voltage VDDX, the gate G2 is driven by the power supply voltage VDDIO. If the external voltage PAD is equal to or higher than the critical voltage VDDX, the gate G2 is driven by the external voltage PAD.

Figure 4:
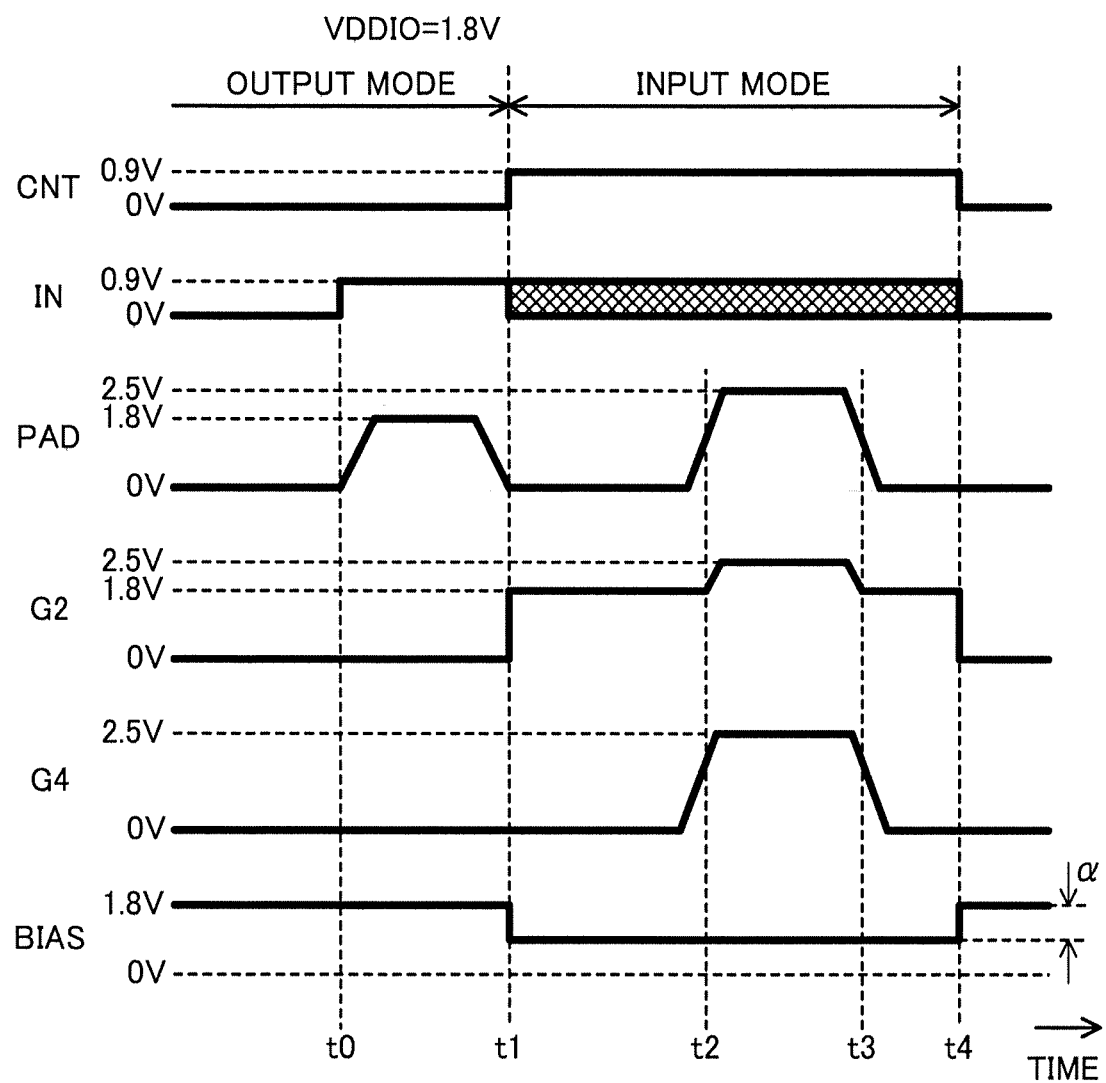
FIG. 4 is a time chart illustrating an operation of the semiconductor integrated circuit of FIG. 1.

FIG. 4 is a time chart illustrating an operation of the semiconductor integrated circuit of FIG. 1. Until a time t1, CNT=L (=0 V). From the time t1 to a time t4, CNT=H (=0.9 V).

According to the example of FIG. 4, since CNT=L (=0 V) until the time t1, the semiconductor integrated circuit of FIG. 1 operates in the output mode. G2=G4=L (=0 V), whereas BIAS=VDDIO (=1.8 V). In addition, until the time t0, IN=L (=0 V) and thus PAD=L (=0 V). From the time t0 to the time t1, IN=H (=0.9 V) and thus PAD=VDDIO (=1.8 V).

Since CNT=H (=0.9 V) from time the t1 to the time t4, the semiconductor integrated circuit of FIG. 1 operates in the non-output (i.e., input) mode. During this period (t1 to t4), BIAS=VDDIO−α, regardless of the H/L of the input data signal IN. Since 0<α<Vth as described above, VDDIO−Vth<BIAS<VDDIO.

According to the example of FIG. 4, the external terminal receives an external voltage at a low logic level represented by PAD=L (=0 V) from time the t1 to the time t2. Since PAD<VDDIO−Vth in this case, G2=VDDIO (=1.8 V) and G4=PAD (=0V) as described above in Section 2a. From the time t2 to the time t3, the external terminal receives an external voltage of a high logic level represented by PAD=H (=2.5 V). Assuming that the relationship between a and Vth is set to satisfy the expression of PAD≥VDDIO+Vth−α, G2=G4=PAD (=2.5V) as described above in Section 2c. From the time t3 to the time t4, the process returns to the same states as those from the time t1 to the time t2.

In the semiconductor integrated circuit of FIG. 1, the bias voltage BIAS supplied to the gate of the third PMOS transistor P3 in the non-output (i.e., input) mode is lower than the power supply voltage VDDIO by α, where α>0. Therefore, around the time t2 in FIG. 4, even when the external voltage PAD slightly exceeds the power supply voltage VDDIO (=1.8 V), a larger current flows through the third PMOS transistor P3 than in the case where α=0. As a result, the rise in the gate voltage G2 of the second PMOS transistor P2 accelerates to obtain G2=PAD (=2.5 V) immediately. This allows for reduction in transient leakage currents in the second PMOS transistor P2. The drop in the gate voltage G2 of the second PMOS transistor P2 also accelerates around the time t3 in FIG. 4.

According to this embodiment, with the use of transistors with breakdown voltages of 1.8 V, all the MOS transistors shown in FIG. 1 are free from the problem of breakdown, even if an external voltage of 2.5 V is applied to the external terminal. In addition, this configuration effectively reduces the transient leakage currents at the output PMOS transistor, even if an external voltage of 2.5 V higher than the own power supply voltage (=1.8 V) is applied to the external terminal.

Second Embodiment

Figure 5:
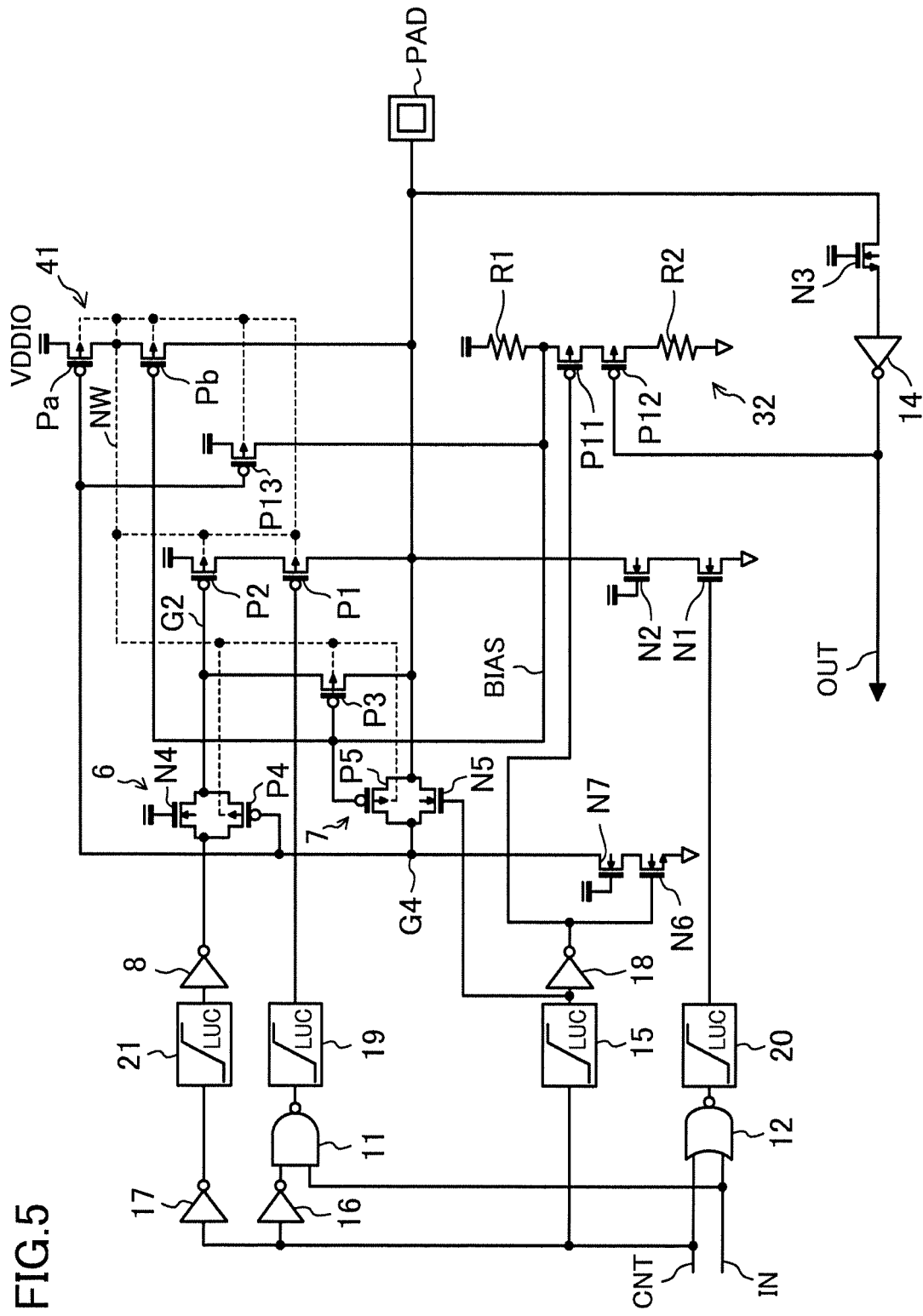
FIG. 5 is a circuit diagram of a semiconductor integrated circuit according to a second embodiment.

FIG. 5 is a circuit diagram of a semiconductor integrated circuit according to a second embodiment. In a bias voltage generating circuit 32 of the semiconductor integrated circuit of FIG. 5, a second bias PMOS transistor P12 is inserted between the first bias PMOS transistor P11 and the second resistive element R2 in FIG. 1. A third bias PMOS transistor P13 is inserted between the power supply terminal VDDIO and the node of the bias voltage BIAS. The gate of the second bias PMOS transistor P12 receives the output data signal OUT from the inverter 14. The gate of the third bias PMOS transistor P13 is connected to the gate G4 of the fourth PMOS transistor P4. The N-well voltage NW is supplied to the back gate of the third bias PMOS transistor P13. The other configurations are the same as or similar to those of the semiconductor integrated circuit of FIG. 1.

Figure 6:
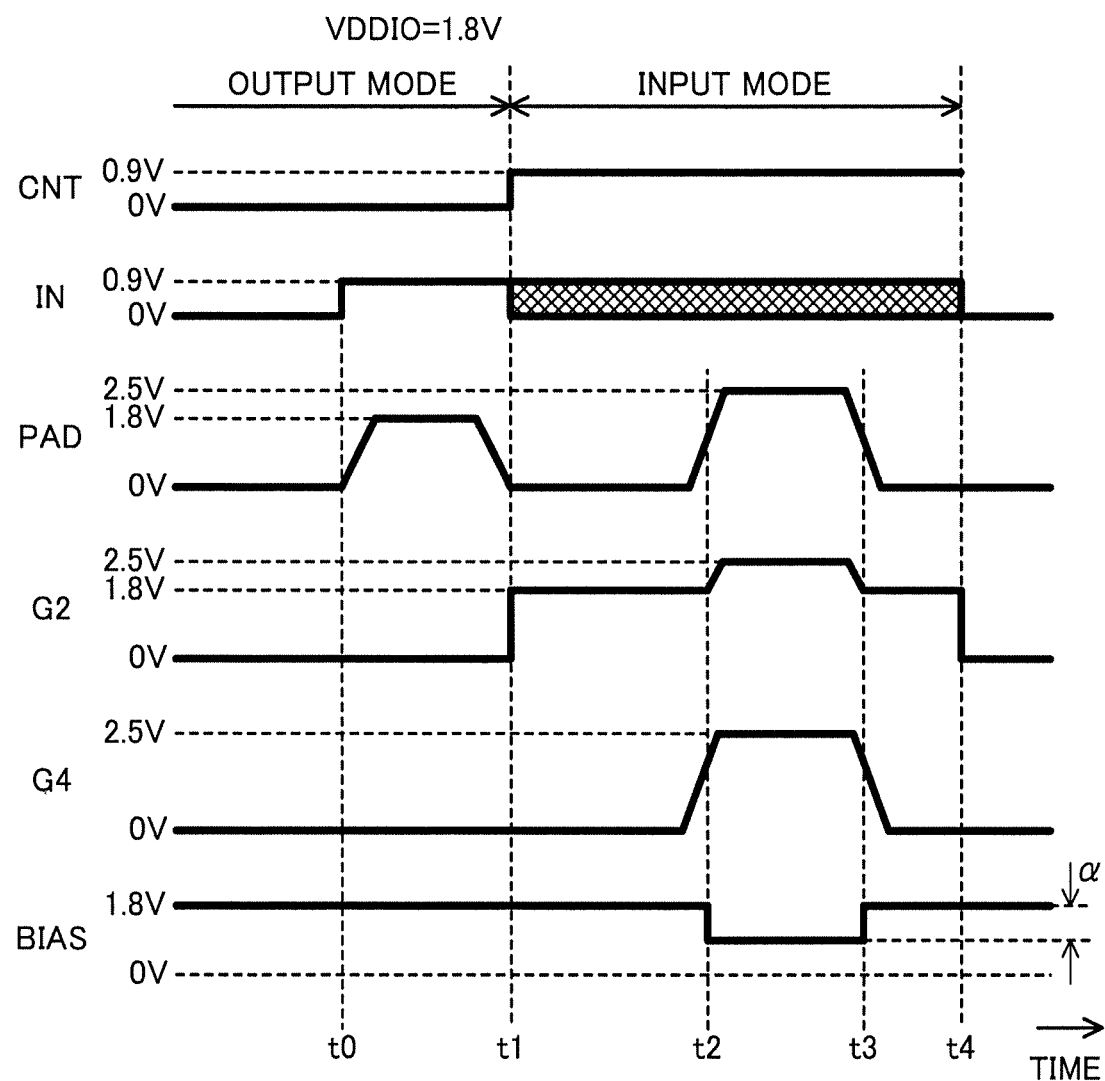
FIG. 6 is a time chart illustrating an operation of the semiconductor integrated circuit of FIG. 5.

FIG. 6 is a time chart illustrating an operation of the semiconductor integrated circuit of FIG. 5. In FIG. 4, BIAS=VDDIO−a from the time t1 to the time t4 in the non-output (i.e., input) mode. In FIG. 6, BIAS=VDDIO−a only during the period from the time t2 to the time t3. Specifically, the second bias PMOS transistor P12 including a gate receiving the output data signal OUT is inserted between the first bias PMOS transistor P11 and the second resistive element R2. This configuration limits the period of BIAS=VDDIO−α to the period (t2 to t3), in which the external terminal receives an external voltage of a high logic level represented by PAD=H (=2.5 V). On the other hand, the third bias PMOS transistor P13 maintains the ON state during the period except the period (t2 to t3) to secure BIAS=VDDIO.

According to this embodiment, the period in which BIAS=VDDIO−α is shorter than that in the first embodiment. This reduces the power consumption, for example, at the bias voltage generating circuit.

Third Embodiment

Figure 7:
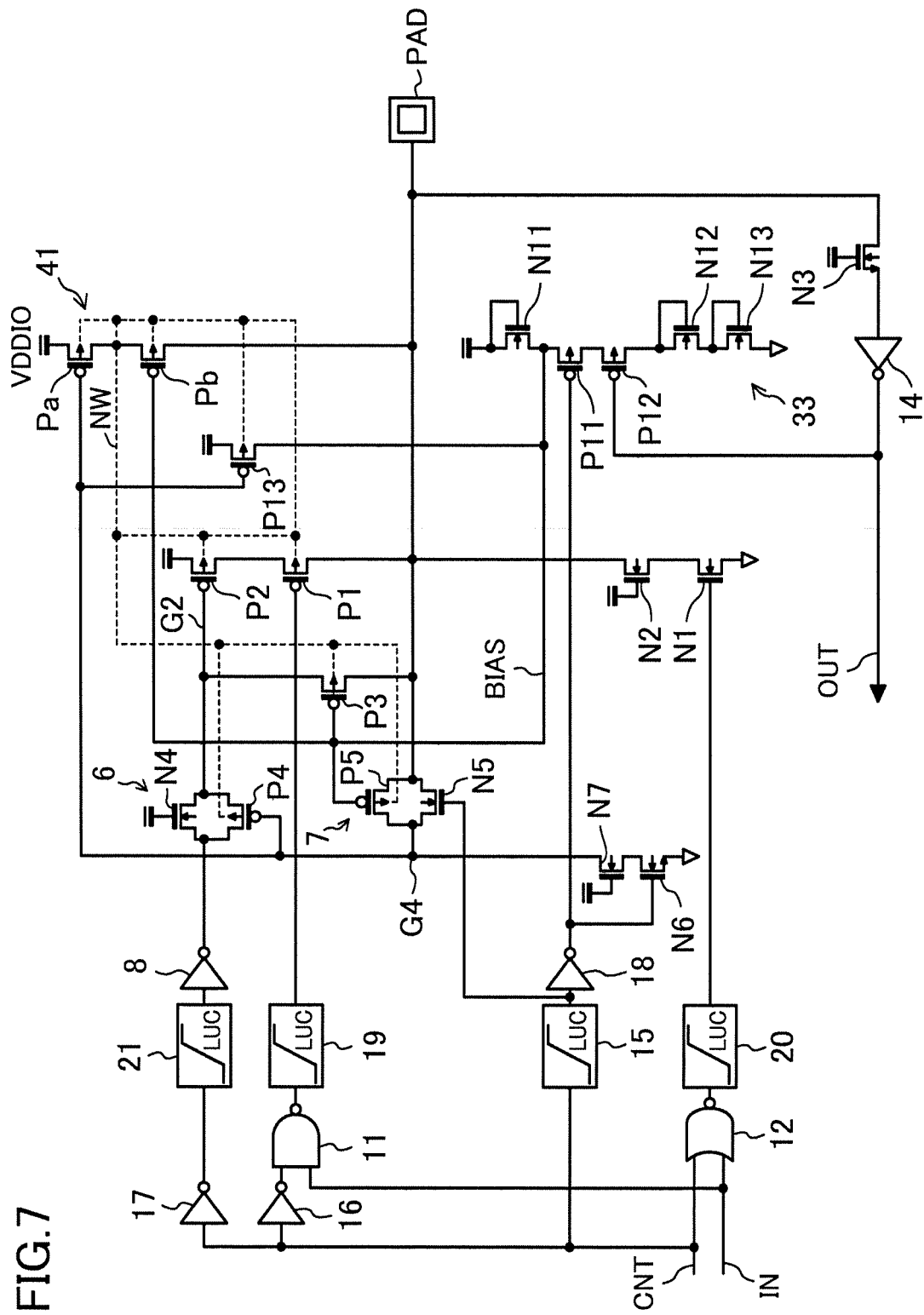
FIG. 7 is a circuit diagram of a semiconductor integrated circuit according to a third embodiment.

FIG. 7 is a circuit diagram of a semiconductor integrated circuit according to a third embodiment. In a bias voltage generating circuit 33 of the semiconductor integrated circuit of FIG. 7, the first resistive element R1 in FIG. 5 is replaced with a diode-connected NMOS transistor N11. The second resistive element R2 in FIG. 5 is replaced with series-connection of two diode-connected NMOS transistors N12 and N13. The other configurations are the same as or similar to those of the semiconductor integrated circuit of FIG. 5.

According to this embodiment, the bias voltage generating circuit requires a smaller area than that of the second embodiment.

Fourth Embodiment

Figure 8:
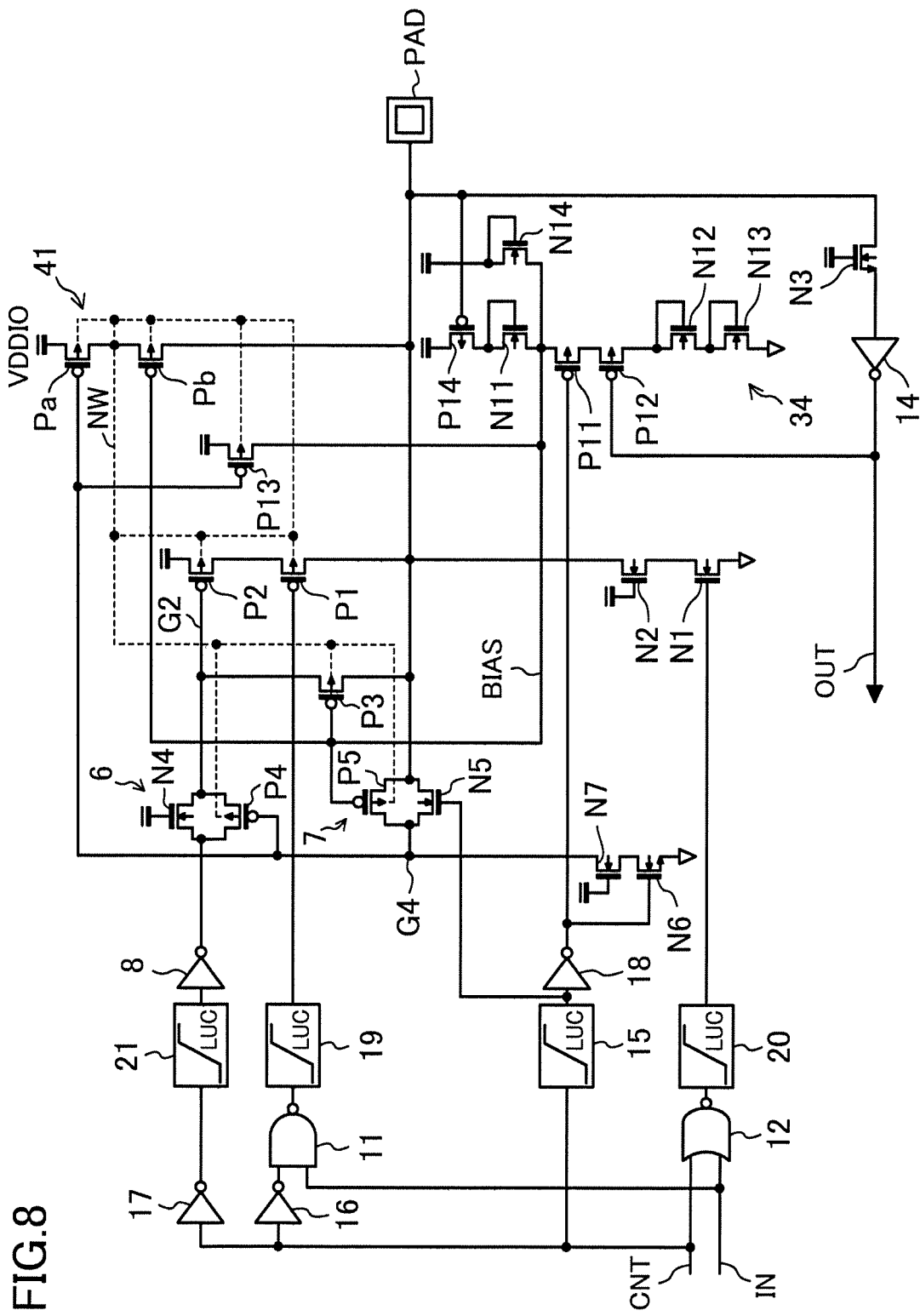
FIG. 8 is a circuit diagram of a semiconductor integrated circuit according to a fourth embodiment.

FIG. 8 is a circuit diagram of a semiconductor integrated circuit according to a fourth embodiment. In a bias voltage generating circuit 34 of the semiconductor integrated circuit of FIG. 8, another diode-connected NMOS transistor N14 is connected in parallel to the diode-connected NMOS transistor N11 in FIG. 7. A fourth bias PMOS transistor P14 is inserted between the NMOS transistor N11 and the power supply terminal VDDIO. The gate of the fourth bias PMOS transistor P14 is connected to the external terminal PAD. The other configurations are the same as or similar to those of the semiconductor integrated circuit of FIG. 7.

According to the present embodiment, while the external voltage received at the external terminal PAD maintains the high logic level in the non-output (i.e., input) mode, the fourth bias PMOS transistor P14 blocks the current flowing through the diode-connected NMOS transistor N11. This reduces the power consumption at the bias voltage generating circuit, as compared to the third embodiment. Note that proper selection of the transistor sizes reduces variations in the bias voltage BIAS caused by the on/off state of the fourth bias PMOS transistor P14.

Fifth Embodiment

Figure 9:
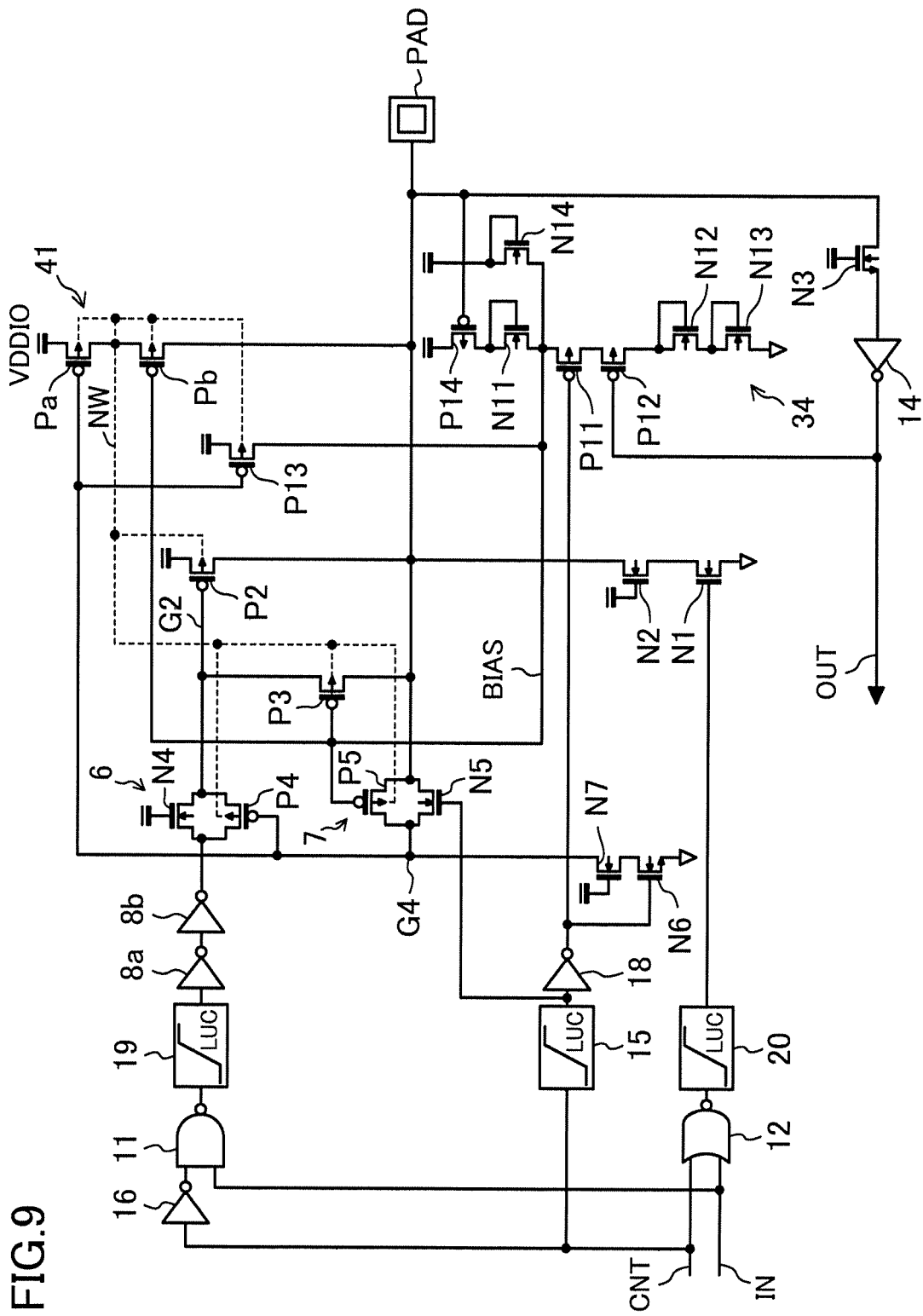
FIG. 9 is a circuit diagram of a semiconductor integrated circuit according to a fifth embodiment.

FIG. 9 is a circuit diagram of a semiconductor integrated circuit according to a fifth embodiment. In the semiconductor integrated circuit of FIG. 9, the first PMOS transistor P1, the fourth LUC 21, and the two inverters 8 and 17 in FIG. 8 are not provided. The input of the first transfer gate 6 is modified to be supplied from the output of the second LUC 19 via the two stages of inverters 8a and 8b. The other configurations are the same as or similar to those of the semiconductor integrated circuit of FIG. 8.

The gate G2 of the second PMOS transistor P2 is driven by a signal corresponding to the input data signal IN in the output mode. In the non-output (i.e., input) mode, if the external voltage PAD is lower than the critical voltage VDDX, the gate G2 is driven by the power supply voltage VDDIO. If the external voltage PAD is equal to or higher than the critical voltage VDDX, the gate G2 is driven by the external voltage PAD.

As described above, in the semiconductor integrated circuit of FIG. 9, only the second PMOS transistor P2 is the power source-side transistor constituting the output circuit. This configuration is also free from the problem of breakdown. For example, even if an external voltage of 2.5 V is applied to the external terminal PAD at VDDIO=1.8 V, no voltage of 1.8 V or higher is applied to the gate oxide film of the second PMOS transistor P2.

According to this embodiment, the first PMOS transistor P1 and the fourth LUC 21 occupying a large area are not provided. Thus, the semiconductor integrated circuit requires a smaller area than in the fourth embodiment. In the semiconductor integrated circuits of the first to third embodiments, the first PMOS transistor P1 and the fourth LUC 21 may be omitted similarly.

As described above, the semiconductor integrated circuit according to the present disclosure has an advantage of reducing transient leakage currents upon receipt of an external voltage higher than its own power supply voltage. The semiconductor integrated circuit is thus useful as a semiconductor integrated circuit including a directly connectable external terminal.

What is claimed is:

1. A semiconductor integrated circuit comprising:
   a first input terminal that receives a control signal for controlling switching between an output mode and a non-output mode;
   a second input terminal that receives an input data signal;
   a power supply terminal that receives a power supply voltage;
   an external terminal capable of receiving an external voltage higher than the power supply voltage in the non-output mode; and
   a first PMOS transistor and a second PMOS transistor connected in series between the power supply terminal and the external terminal, wherein
   a gate of the first PMOS transistor is driven:
      by a signal corresponding to the input data signal in the output mode; and by the power supply voltage in the non-output mode, and
   a gate of the second PMOS transistor is driven:
      by a ground voltage in the output mode; and
      in the non-output mode, where a critical voltage is lower than a sum of the power supply voltage and a threshold voltage of a MOS transistor, by the power supply voltage, if the external voltage received at the external terminal is lower than the critical voltage; and by the external voltage received at the external terminal, if the external voltage received at the external terminal is higher than or equal to the critical voltage, and
   the critical voltage is higher than the power supply voltage.

2. The semiconductor integrated circuit of claim 1, further comprising:
   a third PMOS transistor connected between the gate of the second PMOS transistor and the external terminal; and
   a bias voltage generating circuit including an output connected to a gate of the third PMOS transistor, wherein
   the bias voltage generating circuit outputs:
      the power supply voltage in the output mode; and
      a voltage lower than the power supply voltage, if the external voltage received at the external terminal is at a high logic level in the non-output mode.

3. The semiconductor integrated circuit according to claim 2, wherein
   the bias voltage generating circuit outputs a voltage lower than the power supply voltage and higher than a difference obtained through subtraction of the threshold voltage of a MOS transistor from the power supply voltage, if the external voltage received at the external terminal is at the high logic level in the non-output mode.

4. The semiconductor integrated circuit according to claim 2, wherein
   the bias voltage generating circuit outputs a voltage lower than the power supply voltage, if the external voltage received at the external terminal is at a low logic level in the non-output mode.

5. The semiconductor integrated circuit according to claim 2, wherein
   the bias voltage generating circuit outputs the power supply voltage, if the external voltage received at the external terminal is at a low logic level in the non-output mode.

6. The semiconductor integrated circuit according to claim 2, wherein
   the bias voltage generating circuit includes a voltage divider circuit including a resistive element or a diode-connected MOS transistor.

7. The semiconductor integrated circuit according to claim 2, wherein
   the bias voltage generating circuit is configured to reduce current consumption of the bias voltage generating circuit, while the external voltage received at the external terminal maintains the high logic level in the non-output mode.

8. A semiconductor integrated circuit comprising:
   a first input terminal that receives a control signal for controlling switching between an output mode and a non-output mode;
   a second input terminal that receives an input data signal;
   a power supply terminal that receives a power supply voltage;
   an external terminal capable of receiving an external voltage higher than the power supply voltage in the non-output mode;
   an output PMOS transistor connected between the power supply terminal and the external terminal,
   an auxiliary PMOS transistor connected between the gate of the output PMOS transistor and the external terminal; and
   a bias voltage generating circuit including an output connected to a gate of the auxiliary PMOS transistor, wherein
   a gate of the output PMOS transistor is driven:
      by a signal corresponding to the input data signal in the output mode; and in the non-output mode, where a critical voltage is lower than a sum of the power supply voltage and a threshold voltage of a MOS transistor, by the power supply voltage, if the external voltage received at the external terminal is lower than the critical voltage; and by the external voltage received at the external terminal, if the external voltage received at the external terminal is higher than or equal to the critical voltage,
   the bias voltage generating circuit outputs:
      the power supply voltage in the output mode; and
      a voltage lower than the power supply voltage, if the external voltage received at the external terminal is at a high logic level in the non-output mode; and a voltage lower than the power supply voltage, if the external voltage received at the external terminal is at a low logic level in the non-output mode.

9. The semiconductor integrated circuit according to claim 8, wherein
the critical voltage is higher than the power supply voltage.

10. The semiconductor integrated circuit according to claim 8, wherein
the bias voltage generating circuit outputs a voltage lower than the power supply voltage and higher than a difference obtained through subtraction of the threshold voltage of a MOS transistor from the power supply voltage, if the external voltage received at the external terminal is at the high logic level in the non-output mode.

11. The semiconductor integrated circuit according to claim 8, wherein
the bias voltage generating circuit includes a voltage divider circuit including a resistive element or a diode-connected MOS transistor.

12. The semiconductor integrated circuit according to claim 8, wherein
the bias voltage generating circuit is configured to reduce current consumption of the bias voltage generating circuit, while the external voltage received at the external terminal maintains the high logic level in the non-output mode.

13. A semiconductor integrated circuit comprising:
a power supply terminal;
an external terminal;
an output PMOS transistor connected between the power supply terminal and the external terminal;
an auxiliary PMOS transistor connected between the gate of the output PMOS transistor and the external terminal; and
a bias voltage generating circuit connected to a gate of the auxiliary PMOS transistor, wherein
the bias voltage generating circuit supplies a voltage lower than a power supply voltage to the gate of the auxiliary PMOS transistor, if it is necessary to maintain an OFF state of the output PMOS transistor by supplying an external voltage received at the external terminal to the gate of the output PMOS transistor, and
the bias voltage generating circuit is configured to reduce current consumption of the bias voltage generating circuit, while the external voltage received at the external terminal maintains a high logic level.

14. The semiconductor integrated circuit according to claim 13, wherein
the voltage supplied from the bias voltage generating circuit to the gate of the auxiliary PMOS transistor is higher than a difference obtained through subtraction of a threshold voltage of a MOS transistor from the power supply voltage.

15. The semiconductor integrated circuit according to claim 13, wherein
the bias voltage generating circuit is a voltage divider circuit including resistive elements or diode-connected MOS transistors.

* * * * *